United States Patent
Jeong et al.

(10) Patent No.: US 9,777,392 B2
(45) Date of Patent: Oct. 3, 2017

(54) METHOD OF FABRICATING SINGLE CRYSTAL COLLOIDAL MONOLAYER ON SUBSTRATE AND DISPLAY DEVICE COMPRISING THE SUBSTRATE

(71) Applicant: Industry-Academic Cooperation Foundation, Yonsei University, Seoul (KR)

(72) Inventors: Unyong Jeong, Paju si (KR); JaeMin Myoung, Goyang si (KR); Taeil Lee, Seoul (KR); ChooJin Park, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 498 days.

(21) Appl. No.: 14/331,387

(22) Filed: Jul. 15, 2014

(65) Prior Publication Data
US 2015/0024177 A1 Jan. 22, 2015

(30) Foreign Application Priority Data

Jul. 19, 2013 (KR) ........................ 10-2013-0085178

(51) Int. Cl.
| C30B 1/12 | (2006.01) |
| C30B 29/02 | (2006.01) |
| C30B 29/54 | (2006.01) |
| C30B 30/00 | (2006.01) |
| C30B 5/00 | (2006.01) |
| C30B 29/16 | (2006.01) |
| B82Y 20/00 | (2011.01) |
| B82Y 40/00 | (2011.01) |

(52) U.S. Cl.
CPC ............. *C30B 1/12* (2013.01); *C30B 5/00* (2013.01); *C30B 29/02* (2013.01); *C30B 29/16* (2013.01); *C30B 29/54* (2013.01); *C30B 30/00* (2013.01); *B82Y 20/00* (2013.01); *B82Y 40/00* (2013.01); *Y10T 428/24851* (2015.01)

(58) Field of Classification Search
CPC .. C30B 1/00; C30B 1/12; C30B 29/54; C30B 29/56
See application file for complete search history.

(56) References Cited

U.S. PATENT DOCUMENTS

| 5,180,470 A * | 1/1993 | Smith ................ B29C 55/00 117/106 |
| 5,207,862 A * | 5/1993 | Baker ................ C30B 7/00 117/3 |
| 7,291,223 B2 * | 11/2007 | Lazarev ............. C09K 19/00 117/68 |

FOREIGN PATENT DOCUMENTS

KR    10-2008-0049542    6/2008

OTHER PUBLICATIONS

K. L. Johnson, K. Kendall and A. D. Roberts, Surface Energy and the Contact of Elastic Solids, Proceedings of the Royal Society of London. Series A, Mathematical and PhysicaiSciences, vol. 324, No. 1558 (Sep. 8, 1971), pp. 301-313.

* cited by examiner

*Primary Examiner* — Robert M Kunemund

(57) ABSTRACT

Disclosed is a method of fabricating a single crystal colloidal monolayer on a substrate. The method includes preparing a pair of adhesive substrates, arranging powder particles between the substrates, and uniaxially rubbing one of the substrates in any one direction to allow the particles to be close-packed between the substrates, thereby forming a single crystal monolayer.

19 Claims, 19 Drawing Sheets

METHOD OF FABRICATING SINGLE CRYSTAL COLLOIDAL MONOLAYER ON SUBSTRATE AND DISPLAY DEVICE COMPRISING THE SUBSTRATE

CROSS REFERENCE TO RELATED APPLICATION

The present application claims priority from Korean Patent Application Number 10-2013-0085178 filed on Jul. 19, 2013, the entire contents of which are incorporated herein for all purposes by this reference.

BACKGROUND OF THE INVENTION

The present invention relates, in general, to a method of fabricating a single crystal colloidal monolayer and, more particularly, to a method of fabricating a wide-area single crystal colloidal monolayer in a short time.

Generally, there are attempts to align and structuralize particles such as colloidal particles on a substrate. Here, the particles are required to be aligned in a monolayer over a large area without defects.

Assembled particle monolayers are ordered arrays of uniformly-sized particles. They have long been investigated both theoretically and experimentally. With tunable feature dimensions depending on the particle size, they can be used as lithographic masks to fabricate patterned surfaces with micro- or nanostructures. Their periodic structures have attracted significant interest related to the creation of photonic crystals and optical sensors, antireflective surfaces, superhydrophobic or superhydrophilic surfaces, and self-cleaning surfaces. Recently, the localized surface plasmon resonance (LSPR) and surface-enhanced Raman scattering (SERS) coming from noble metal nanopatterns with high spatial resolutions have been utilized in researches for biosensors, photovoltaics, and light manipulation. A colloidal monolayer can serve as an excellent template for the preparation of ordered metallic nanostructures.

Over the past decades, fabrication of the colloidal monolayers has seen a tremendous amount of success. A variety of processes have been explored to create highly ordered, large-area assemblies. Direct assembly on a target substrate from a colloidal suspension has been the common approach, which includes solvent evaporation on a flat surface, dip-coating, spin-coating, electrostatic and electrophoretic deposition. These approaches using the convective flow request delicate evaporation conditions to obtain a monolayer with large surface coverage. Moreover, cracks are unavoidable due to the decrease in volume while the solvent evaporates. Although self-assembly at the air-water interface allows for the formation of a high-quality, large-area colloidal monolayer without cracks, the preparation of a single crystal monolayer over a large area has been a major challenge. Perfect spatial registry has been attempted with evaporation-assisted deposition on physical templates that were fabricated by conventional lithography or by a wrinkling process. However, this solution-based template approach is slow and sensitive to the evaporation conditions.

Although self-assembled colloidal particles can be widely used, problems arise in that it is not easy to reproduce them and it is difficult to form a monolayer over a large area.

DOCUMENT OF RELATED ART

[Patent Document 1] Korean Patent laid-open Publication No. 10-2008-49542

The information disclosed in the background of the invention is provided only for enhancement of (or better) understanding of the background of the invention, and should not be taken as an acknowledgment or any form of suggestion that this information forms a prior art that would already be known to a person skilled in the art.

SUMMARY OF THE INVENTION

Accordingly, the present invention has been made keeping in mind the above problems occurring in the related art, and an object of the present invention is to propose a method of fabricating a single crystal colloidal monolayer over a large area at a low cost without any limitation.

In order to achieve the above object, according to one aspect of the present invention, there is provided a method of fabricating a single crystal colloidal monolayer on a substrate, the method including: preparing a pair of adhesive substrates; arranging powder particles between the substrates; and uniaxially rubbing one of the substrates in any one direction to allow the particles to be close-packed between the substrates, thereby forming a single crystal monolayer.

In an embodiment, the substrate may include a substrate made of a rubbery material.

In an embodiment, the substrate may include a substrate in which a rubbery material is formed on a non-elastic base substrate.

In an embodiment, the rubbery material may be PDMS.

In an embodiment, the stage of forming the single crystal monolayer may include individually separating the power particles one by one, and rolling-moving and close-packing the separated powder particles over the entire surface of the substrate.

In an embodiment, the tack energy or adhesion energy between the particle and the substrate may be greater than that between the particles.

In an embodiment, the powder particles may be only moved by rolling without sliding for the close-packing of the power particles over the entire surface of the substrate.

In an embodiment, the packing direction of the particles may be determined by the uniaxial rubbing direction.

In an embodiment, the rolling may be performed faster and under a lower pressure as the size of the particle increases.

In an embodiment, the method may further include, before the arrangement of the powder particles between the substrates, patterning the adhesive surfaces of the substrates such that the particles are only close-packed on a specified region where the adhesion still remains.

In an embodiment, the stage of patterning the adhesive surfaces of the substrates may include patterning the surfaces of the substrates via ultraviolet-ozone (UVO) treatment such that the particles are only close-packed on a specified region where the UVO treatment is not performed.

In an embodiment, the method may further include distributing a CNT or nano-wire dispersed solution over the single crystal monolayer on the substrates, thereby forming a network structure in which the CNT or metal nano-wire is networked at a portion other than a region where the particles exist.

According to another aspect, the present invention provides a display device including a substrate having a specified pattern, wherein the substrate is a substrate made of a rubbery material or a substrate forming a rubbery material on a non-elastic base substrate, wherein the surface of the substrate is provided with a single crystal monolayer being close-packed in a specified direction with power particles, and wherein tack energy or adhesion energy between the particle and the substrate is greater than that between the particles.

In an embodiment, the rubbery material may be PDMS.

In an embodiment, the adhesive surfaces of the substrates may be patterned to form the specified pattern such that the particles are only close-packed on a specified region where the adhesion still remains.

In an embodiment, the adhesive surfaces of the substrates may be patterned via ultraviolet-ozone (UVO) treatment to form the specified pattern such that the particles are only close-packed on a specified region where the UVO treatment is not performed.

In an embodiment, a CNT or metal nano-wire may be networked at a portion other than a region where the particles exist, thereby forming a network structure.

According to the present invention, a single crystal colloidal monolayer can be simply and economically fabricated over the large area without specific limitations.

BRIEF DESCRIPTION OF THE DRAWINGS

The above and other objects, features and advantages of the present invention will be more clearly understood from the following detailed description when taken in conjunction with the accompanying drawings, in which.

DETAILED DESCRIPTION OF THE INVENTION

Reference will now be made in greater detail to a preferred embodiment of the invention, an example of which is illustrated in the accompanying drawings. In the description, technical constructions well-known the art will not be described. In spite of such exclusion of description, one skilled in the art may easily understand characteristic features of the present invention upon reading of the following description.

As described below, the uniaxial rubbing of dry powder of spherical particles sandwiched between two flat rubbery substrates guides the self-assembly of the particles into a close-packed single-crystal monolayer on the whole surface area of the substrates (see diffraction peaks shown in FIG. 10, wherein the diffraction peaks show clear hexagonal-spot, which is a characteristic feature of a single crystal colloidal monolayer). Such a wafer-scale assembly process can be completed within 10 seconds. This mechanically-driven process, rather than the conventional surface potential-driven assembly or evaporation-induced ordering, is applicable to particles having a size ranging 100 nm to mm. The practical variables (normal pressure, rubbing speed, tack energy (also referred hereinafter to as 'adhesion energy') of the substrate) offer conditions for the formation of a single-crystal particle assembly depending on the particle size. As a result of rubbing particles on a substrate with a pattern of tack energy, a complicated micro-pattern of a monolayer particle assembly with the same crystal orientation is formed. Colloidal crystals rubbed in different directions form large grains along the rubbing direction, hence reflect different colors. This color-tuning capability offers a new fine-art painting technique (referred to as 'photonic crystal painting'), which is similar to lacquering.

The present invention introduces uniaxial rubbing of particle powder as a quick and highly reproducible means to fabricate a single-crystal colloidal monolayer on a flat or curved substrate. The assembly on a wafer-scale substrate generally takes less than 10 seconds. The process of the present invention has no limitation on the size, curvature or the like of the substrate. With the patterning of the tack energy of the substrate, a complicated colloidal pattern having a controlled colloid direction is formed. We expand this scientific finding to photonic crystal painting as a new fine-art painting technique, in which pictures are colored with a rubber pen by rubbing the photonic dyestuff (particle powder) in different directions.

Figure 1:
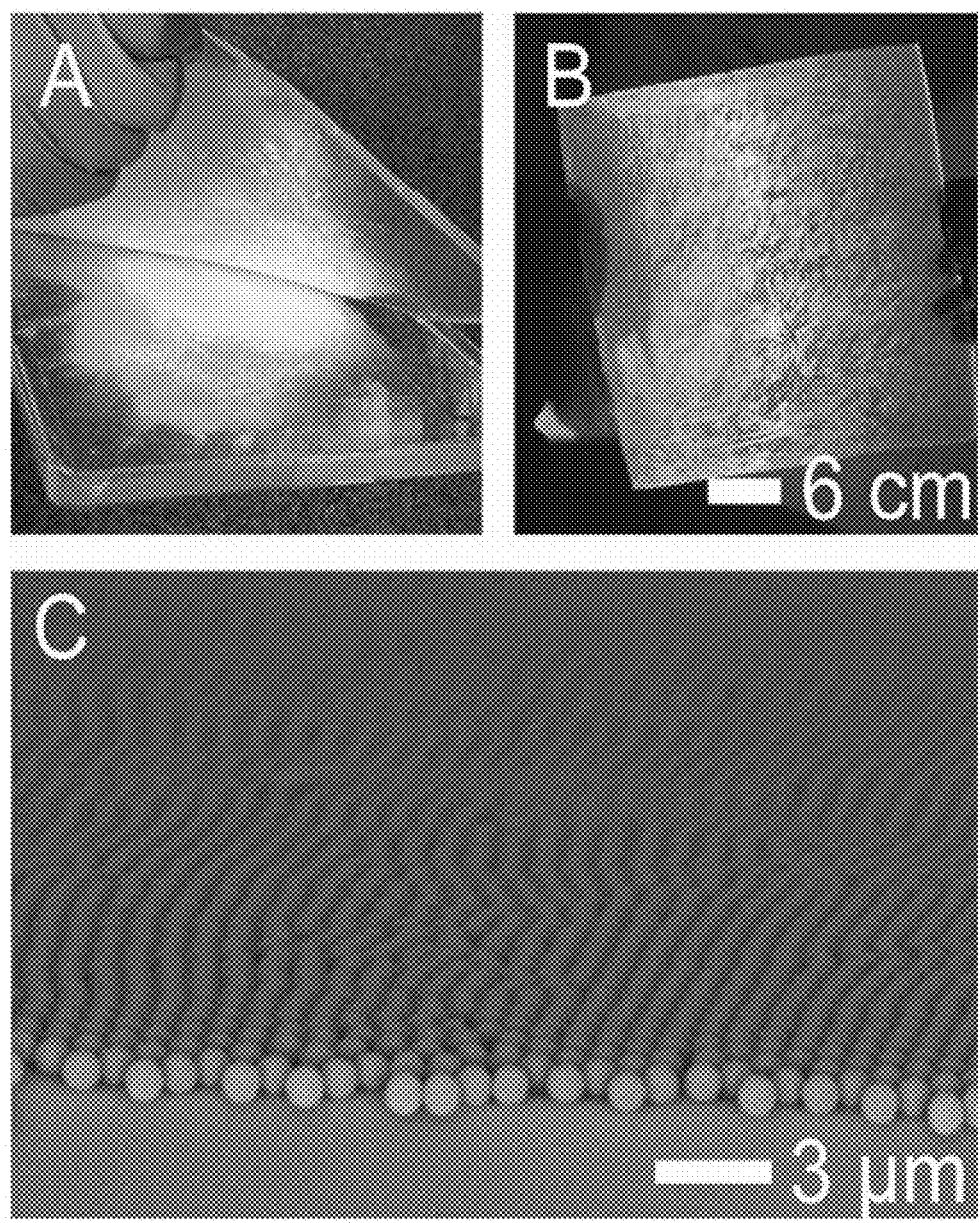
FIG. 1 is a schematic view showing a rubbing process according to the present invention.

FIG. 1A demonstrates the rubbing process used in an embodiment of the present invention. That is, particles are close-packed by the rubbing between two rubbery substrates such that particles adhere to the substrate due to an adhesive feature of the substrate and other particles remaining between the two substrates close-pack the adhered particles layer until the particles fills the whole surface area of the substrate. A resulting object is called a "colloidal crystal". Specifically, the top and bottom layers are flat polydimethylsiloxane (PDMS) rubbery substrates. Particle powders (polystyrene (PS) powders, 1 μm in diameter) were placed on the bottom substrate and rubbed with the top substrate in a random direction. Within 5 seconds of rubbing, the particles were hexagonally close-packed all over the surface of both the top and bottom substrates (20 cm×20 cm) (FIG. 1B). The extra particles that did not join the monolayer assembly were spontaneously swept to the edges of the substrates during the rubbing process. Rapping powders on the substrate during the rubbing resulted in a more excellent, faster assembly process. The tilted scanning electron microscopy (SEM) image in FIG. 1C shows a typical colloidal monolayer obtained by the aforementioned process.

Figure 8:
FIG. 8 is a view showing an example of a glass bottle and a flask in which a monolayer particle assembly is processed by rubbing.

The substrate used in the present invention may be made of a variety of materials so long as they have surface adhesion. For example, FIG. 1C shows a colloidal monolayer which is formed on a substrate in which a silicon wafer is thinly coated with PDMS (FIG. 8 also shows the same case). That is, according to the present invention, the substrate may be made of any kind of material if the material has adhesion. Preferably, the substrate may be a rubbery substrate.

According to an embodiment, the rubbing process uses dry powders in which the particles are physically aggregated. Therefore, the monolayer assembly should involve the separation of the particles from the aggregate, the rolling movement of the particles on the substrate, and the continuous supply of the particles to the bottom layer until the close-packing process is completed on the entire surface (see the insert in FIG. 2).

For the separation of the particles from the aggregates, two conditions should be met; i) the particle-substrate adhesion should be stronger than the particle-particle adhesion, and the shear force applied to the aggregate must be transferred to each particle in the aggregate. When a particle on an adhesive substrate is pulled out, continuous elongational deformation of the rubber is observed. Hence, the particle-substrate adhesion energy (Ep-s) is considered larger than the particle-particle adhesion energy (Ep-p) (the condition under which colloidal arrangement can be obtained by uniaxial rubbing). Attractive energy (Ep-p) between two identical spherical particles can be expressed by Equation on the van der Waals energy. That is, $Ep\text{-}p = (A \cdot R)/(6D_o)$, where A is the Hamaker constant, R is the radius of the particle, and $D_o$ is the atomic distance (typically $D_o = 0.1 \sim 0.2$ nm). The maximum adhesion energy (Ep-s) between the rubber surface and a rounded object was formulated by the JKR theory (K. L. Jonhson, K. Kendail, A. D. Roberts, *Proc. R. Soc. Lond. A* 324 (1558), 301-313 (1971). (JKR)). That is, $Ep\text{-}s = \pi \Delta\gamma_{12}[(9\pi\Delta\gamma_{12}R^2)/(8E)]^{2/3}$, where E and $\Delta\gamma_{12}$ are the Young's modulus of the substrate and the surface energy change by the particle-substrate contact. Therefore, the minimum particle size ($R_{min}$) for this separation condition is estimated, $R_{min} = (1.20 \times 10^{-5})(A/D_o)^3(\Delta\gamma_{12})^{-5}E^2$. Because the $\Delta\gamma_{12}$ is not much variant, the minimum particle size is sensitive to the modulus of the substrate. For the typical modulus of rubber, $R_{min}$ changes within the range of 1 nm~10 nm, which indicates that nano-sized materials can be assembled theoretically on a rubbery surface by rubbing in terms of adhesion energy. However, an aggregate of particles experiences plastic deformation which strongly depends on the size of the particles forming the aggregate. From the analogy to the Hall-Petch effect, as the particle size decreases, a larger shear stress should be applied to the aggregate to let the momentum to be transferred to the particles. Typical criterion of the stress propagation is order of 100 nanometers.

Figure 2:
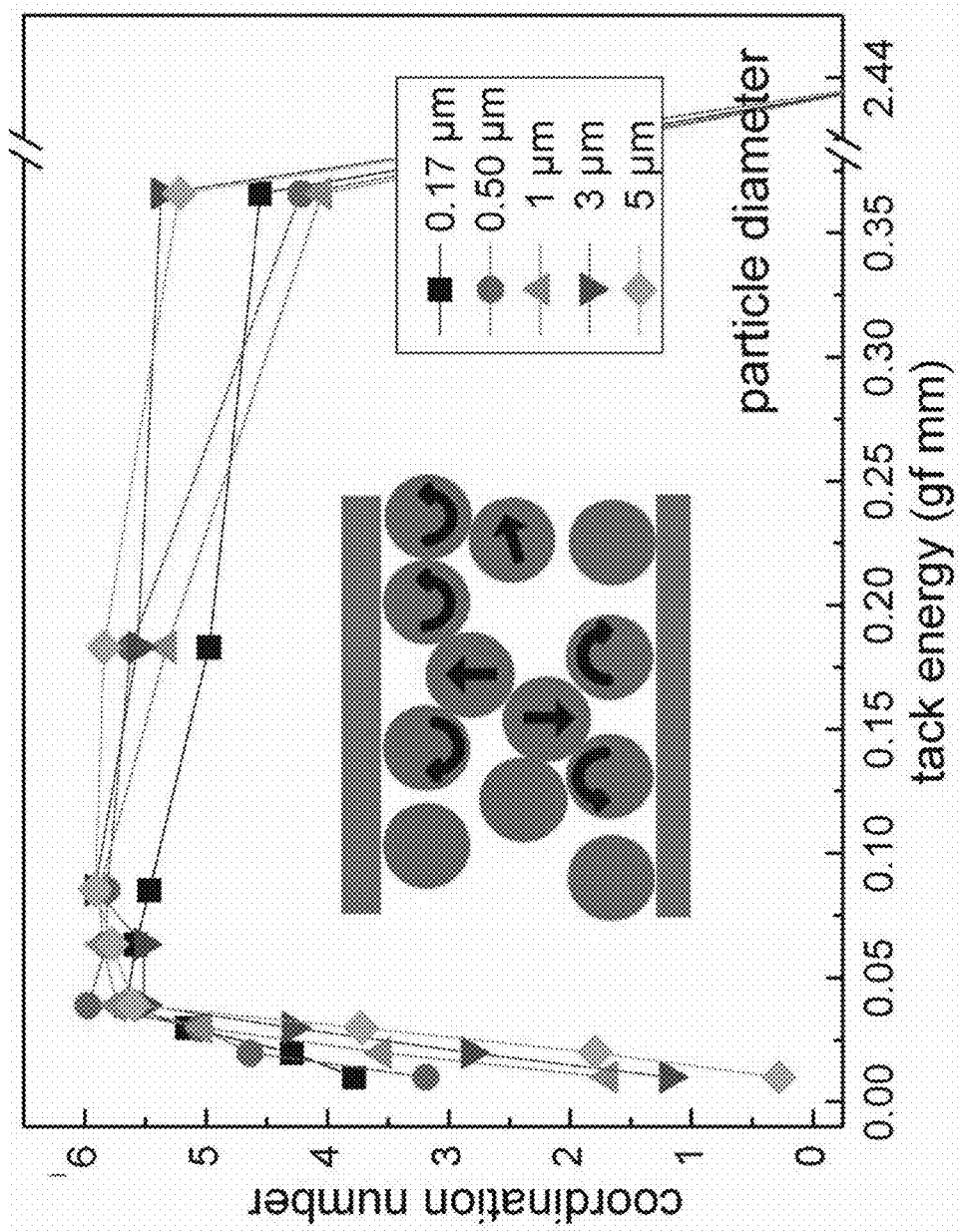
FIG. 2 is a view showing average coordination number of the particles in an assembled monolayer depending on the tack adhesion of the substrates.

Without applied pressure (P) or within a small variation in P, the ordering of the particles largely depends on the adhesion of the substrate. FIG. 2 summarizes the effect of the adhesion energy on the degree of ordering in the monolayer of the PS particles (that is, the degree of packing of the particles varies according to the adhesion energy). The diameter of the particles varied from 170 nm to 5 μm, which is the typical size for colloidal assembly. The pressure applied to the substrate by rubbing was changed (0.5 gf/cm²~3.0 gf/cm²) according to the particle size to obtain the best quality of the monolayer assembly. A push-and-pull tack test is a common measurement of the JKR adhesion. These tests were carried out with a stainless steel ball of 0.32 mm (⅛ in) in diameter under 20 g of pressure. The adhesion energy of the substrates increased as the mixing ratio of the PDMS prepolymer (Sylgard 148) and crosslinker (prepolymer:crosslinker, w/w) was raised, while the adhesion decreased as the exposure time to oxygen plasma was increased. Additionally speaking, if exposed to plasma, the surface of PDMS is changed into silica. As the exposure time increases, the area of silica on the surface increases, thereby gradually decreasing adhesion force. Accordingly, an increase in exposure time to plasma results in a decrease in adhesion force. The adhesion energy of 0.012, 0.021, 0.050, 0.398, 3.814, and 10.685 gf mm in the figure corresponds to the mixing ratio of 3:1, 5:1, 10:1, 20:1, 30:1, and 50:1. In addition, 0.008, 0.006, and 0.001 gf mm correspond to the plasma exposure time of 10, 30, and 60 minutes on the substrate with a 3:1 mixing ratio. In practical sense, we scarcely felt the stickiness of the substrates at a tack adhesion of 0.01 gf mm or less. This adhesion range corresponds to that of a conventional rubber material such as a rubber horse or pad, or a band. Stickiness was clearly felt on the substrates when the tack adhesion was greater than 10 gf mm which is similar to that of sticky tape. The degree of ordering was obtained with the average coordination number of the particle. It was counted from 20 optical microscopy (OM) images or scanning electron microscopy (SEM) images containing more than $10^3$ particles. Due to the presence of grain boundaries and defects, the coordination number did not reach 6.0 that is the value of perfect 2D hexagonal crystal.

Figure 3:
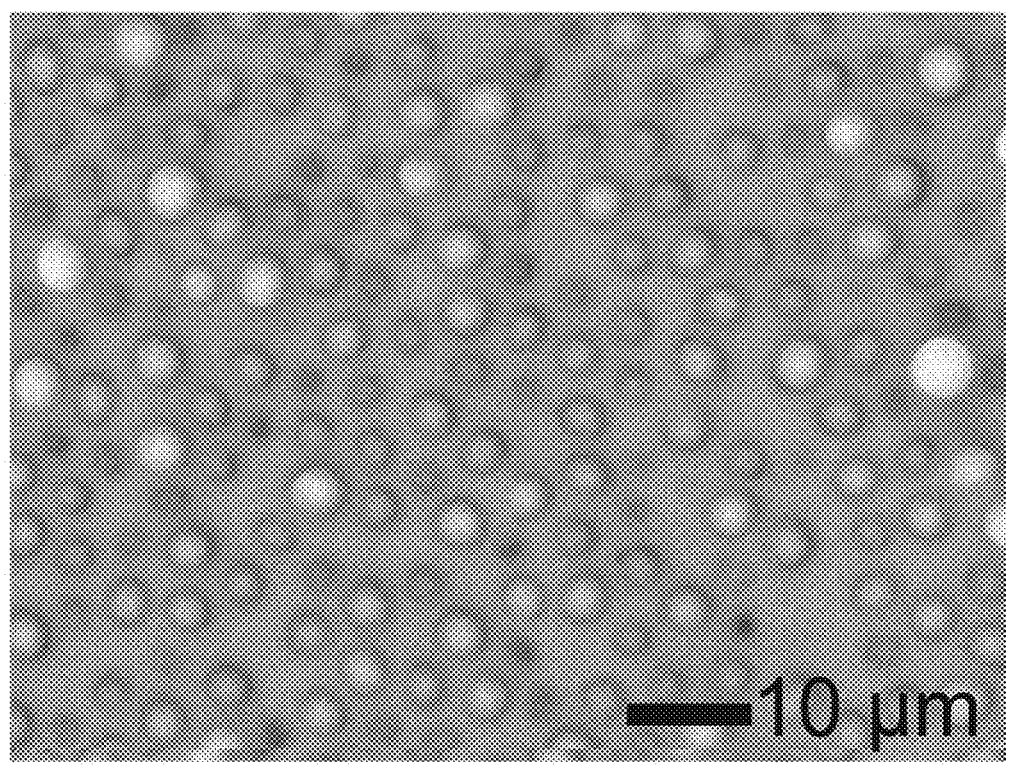
FIG. 3 is a view showing the failure of assembly of particles on a high level of adhesion substrate.

As shown in FIG. 2, the assembly had a window in the adhesion. The particles lost the ordering at high adhesion energy (>10 gf mm) due to the restricted translation during the rubbing process (FIG. 3). Also, the assembly was not successful at low adhesion energy (<0.01 gf mm) because of the prominent sliding of the particles or the aggregates. In an embodiment, when the adhesion energy ranges from 0.01 gf mm to 10 gf mm, the ordering through desired assembly may be obtained. However, the desirable range may vary according to conditions of the push-and-pull tack test, as well as kinds of substrates or balls used for the test.

As seen in FIG. 2, long-range ordering of the particles could be achieved when the movement of the particles includes rolling. In the rolling of a particle with adhesion, shear stress (Q) of the rubber substrate accumulates in the rear edge of the rolling trail. Tension stress emerges near the rear edge within which the adhesion can effectively hold the surfaces in contact as rolling deformation arises. The contact at the front edge and the pull-out at the rear edge constitute the net change in the steady-state rolling process; thus, it can be said that rolling takes place when the tangential force exerted on the particles is greater than the normal force ($F_n$,). Fn on the substrate is the sum of the particle-substrate adhesion force ($F_A$) and the applied normal pressure (P). The rolling friction coefficient ($\mu^R$), defined by the tangential force divided by the normal force as $\mu^R=Q/(F_A+P)$, can be a useful parameter to estimate the resistance of a substrate to rolling. Pure rolling without sliding is the ideal condition for particle assembly. If the particles roll without sliding ($v_{cm}=R\omega$), taking into account the moment of inertia (Im=2 mR$^2$/5), one can formulate $Q=(4/15)\pi R^4 \rho v cm^2$, where $\omega$, $\rho$, and $v_{cm}$ are the angular velocity of the particle, the density of the particles, and the velocity of the center of mass of the particle, respectively. The ideal condition of $\mu^R$ for particle assembly by rubbing can be deduced from Equation for a hard ball rolling down without sliding, $\mu^R=(5/7)(d/R)^{1/2}$. Additionally speaking, a sufficient external force must be applied to separate particles aggregated by pressure one by one in order to perform assembly of particles by rubbing, particle-substrate interaction must be greater than particle-particle interaction, and a force sufficient to allow the particles to at least roll by an external force even though the substrate-particle interaction is greater than the force must be applied.

The ideal value of $\mu^R$ monotonically increases as the indentation (d) of the particle increases. It reaches a maximum of 0.71 when d=R under the assumption that the indentation deeper than half the particle (d>R) prevents rolling. Accordingly, the rubbing speed (motion speed of the substrate) and the applied pressure become practical variables when the kind of the substrate and particle is determined. Actual speed ($v_{cm}$) of particles during rubbing becomes a subject to challenge, because the momentum is transferred through the particle-particle collision. Sliding is also involved upon the movement of particles. It is estimated that the speed ($v_{cm}$) is very slower than the rubbing speed.

Figure 4:
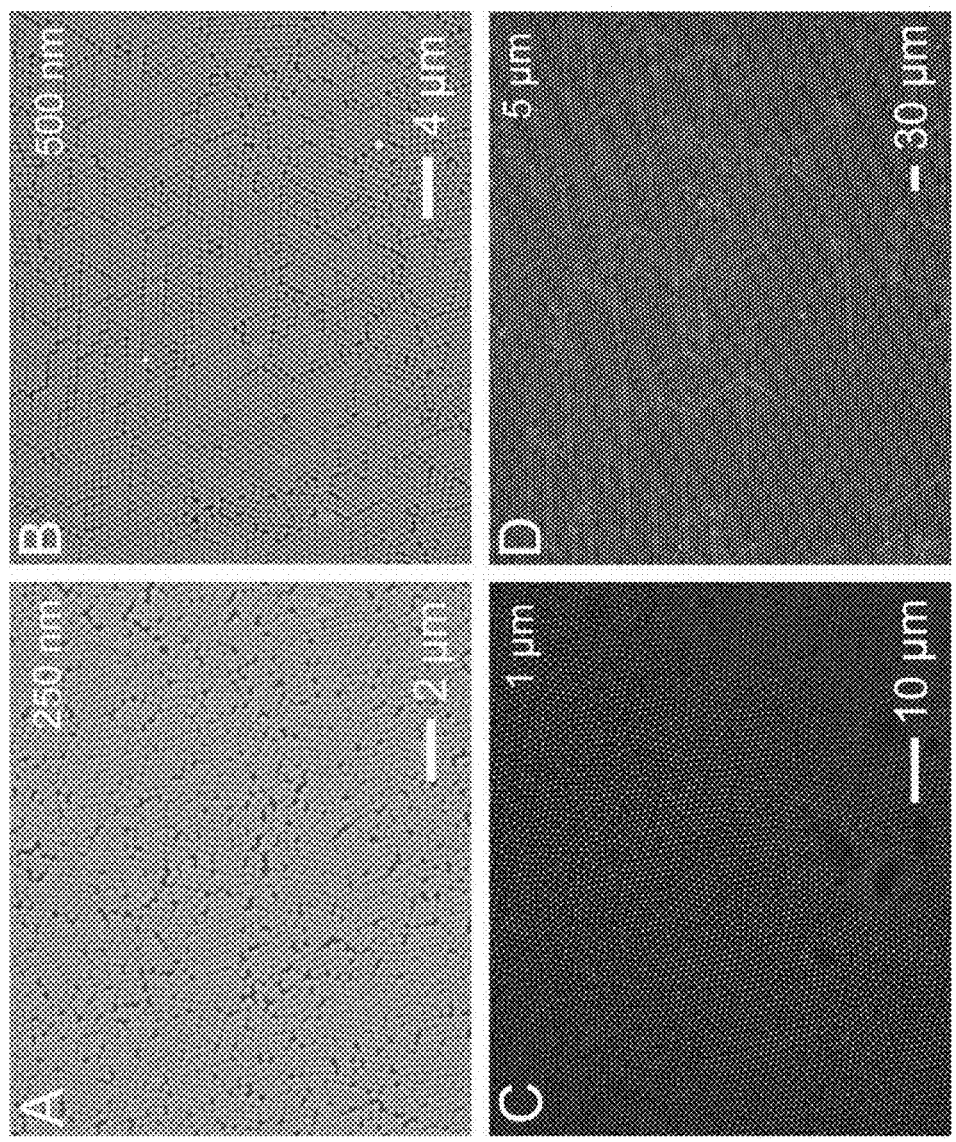
FIG. 4 is a view showing an example using Si wafers spin-coated with polystyrene-block-polybutadiene-block-polystyrene (SBS) block copolymer as substrates for PS particles rubbing.
Figure 5:
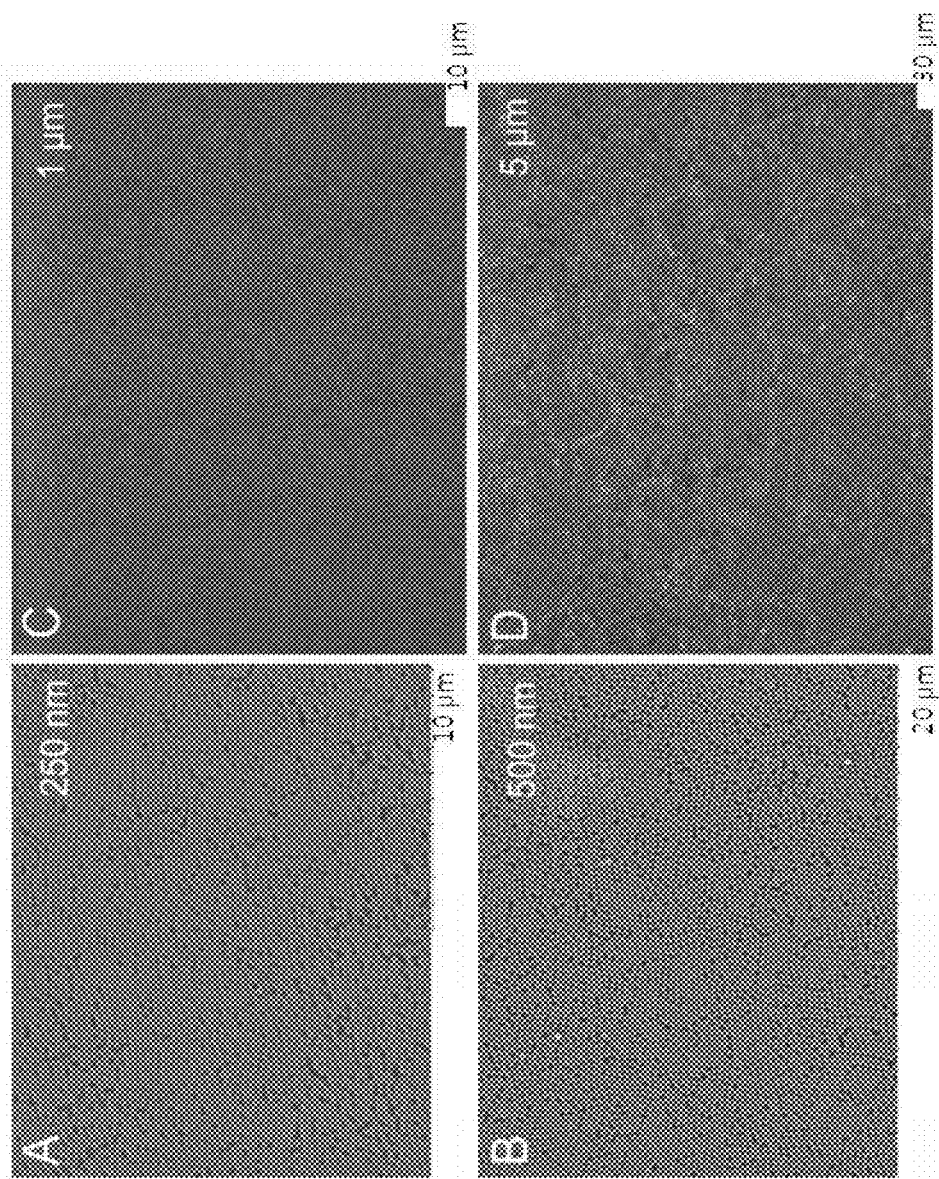
FIG. 5 is a view showing an example using Si wafers coated with polyurethane as substrates for PS particles rubbing.
Figure 6:
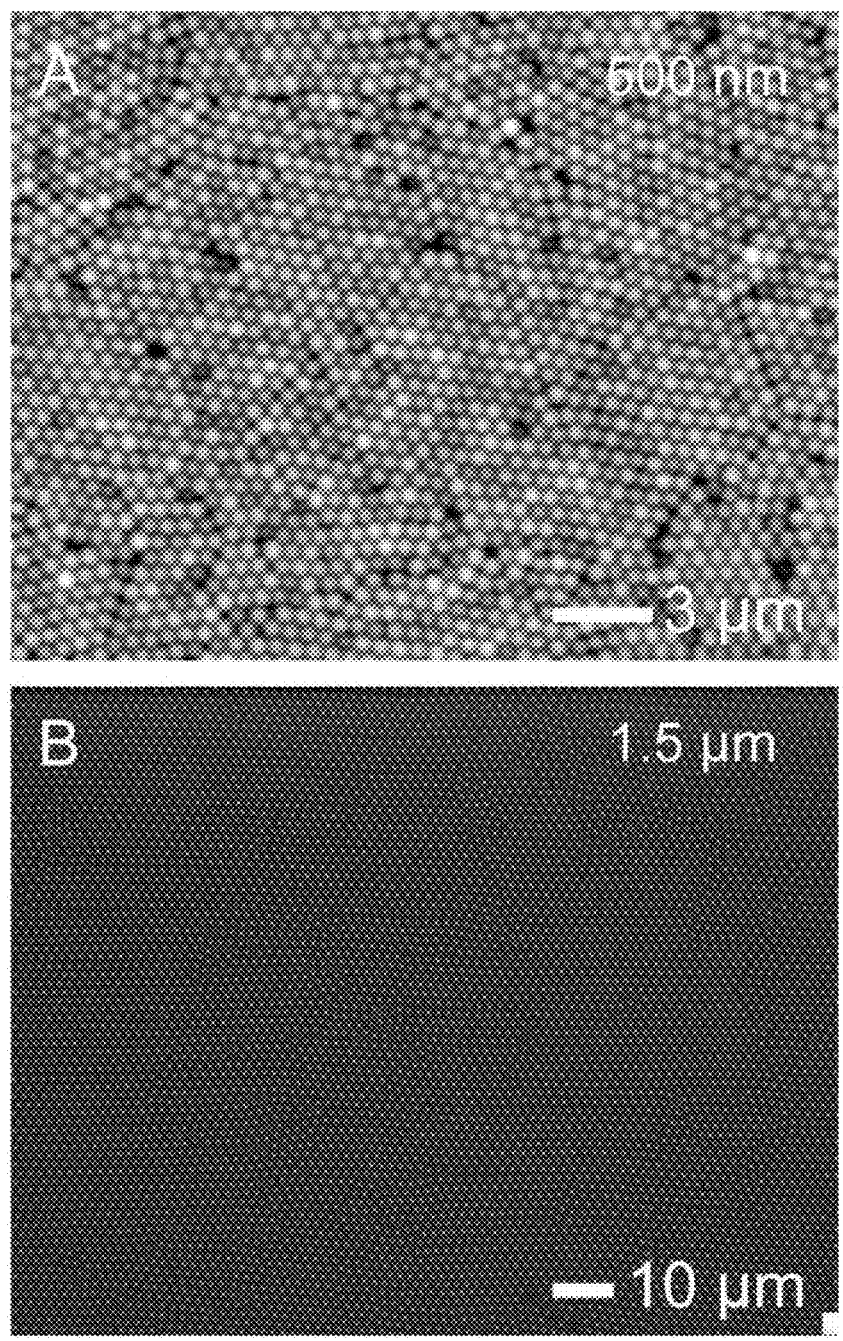
FIG. 6 is a view showing an example using PDMS as substrates for silica particles rubbing.
Figure 7:
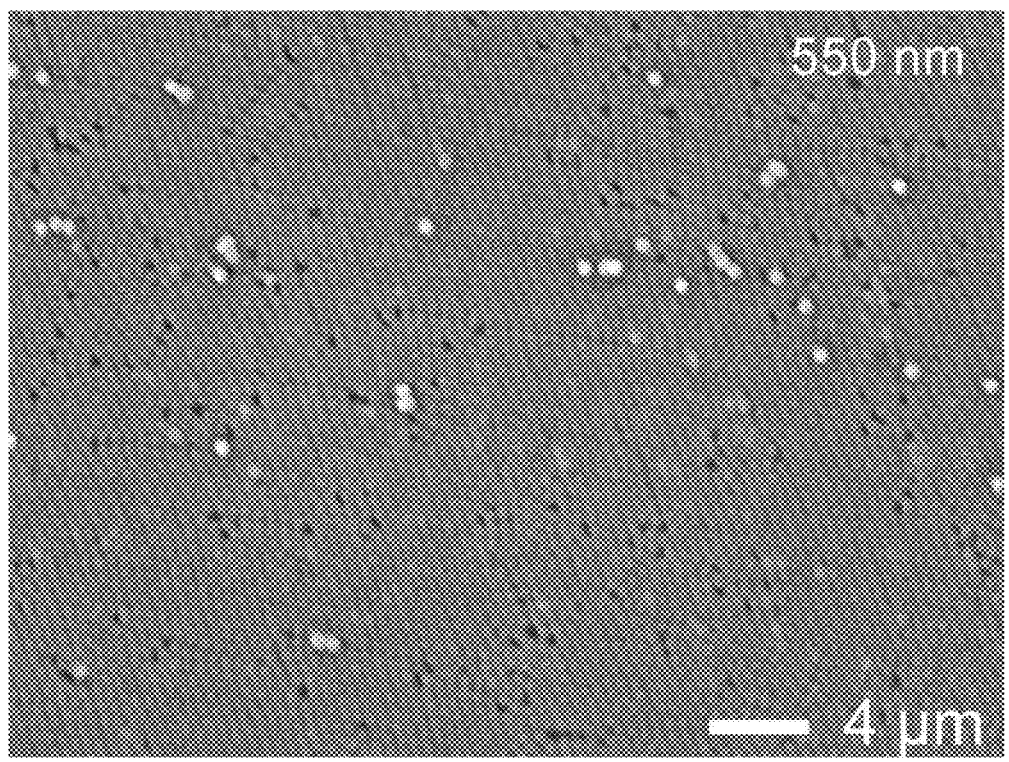
FIG. 7 is a view showing an example using PDMS as substrates for PMMA particle rubbing.

A high-quality assembly (coordination number ≥5.7) was routinely obtained regardless of the particle size as long as the tack energy was in the range of 0.01~3.81 gf mm. Based on this criterion, the rubbing process was applied to other rubbery substrates, such as a thick polyurethane rubber coated Si wafer (FIG. 5) and a polystyrene-block-polybutadiene-block-polystyrene (SBS) block copolymer sin-coated Si wafer (FIG. 4). This monolayer assembly technique was applied to other spherical particles such as silica (FIG. 6) and poly(methylmethacrylate) (PMMA) (FIG. 7), which are both frequently used in the colloidal assembly.

The coordination number in FIG. 2 showed different behaviors at weak adhesion region and strong adhesion region according to the size of particles. At the tack energy higher than 5.81 gf mm, the monolayer assembly of small particles (< micrometer) was not obtained, whereas larger particles (> micrometer) still maintained a certain coordination number of about 4.0 at 3.81 gf mm. At a low tack energy (<0.01 gf mm), the large particles lost their ordering, whereas the small particles maintained the coordination numbers of 3~4. This dependence on the particle size is attributed to the relationships $Q \propto R^4$ and $F_A \propto d$. When the pressure applied to the substrate is identical or varies within a small range, d is proportional to R, hence the value of $\mu^R$ varies by O(R$^3$). $\mu^R$ deviates considerably from the ideal value and the particles lose their assembled order as their sizes increase. For the large particle, $\mu^R$ can be adjusted by the rubbing speed and the applied pressure. Therefore, a practical upper limit with respect to the size does not exist so long as the tack energy lies within a proper range.

Unique additional benefits of this rubbing process are i) no upper limit in size and the formation of a high-quality colloidal monolayer on curved surfaces. Because $\mu^R$ can be adjusted by the rubbing speed and the applied pressure for large particles, the process is applicable to any size (≥~100 nm) as long as the adhesion energy of the substrate is within a proper range. The formation of an assembled monolayer on a curved surface is not achievable by the transfer of a colloidal monolayer formed on a flat substrate. FIG. 8 exhibits examples prepared by rubbing on a small glass bottle and a round-bottomed flask. The surfaces of the glassware were coated with PDMS before rubbing. Due to the characteristics of the photonic crystal, the colloidal monolayer reflects different colors according to the viewing angle.

Figure 9:
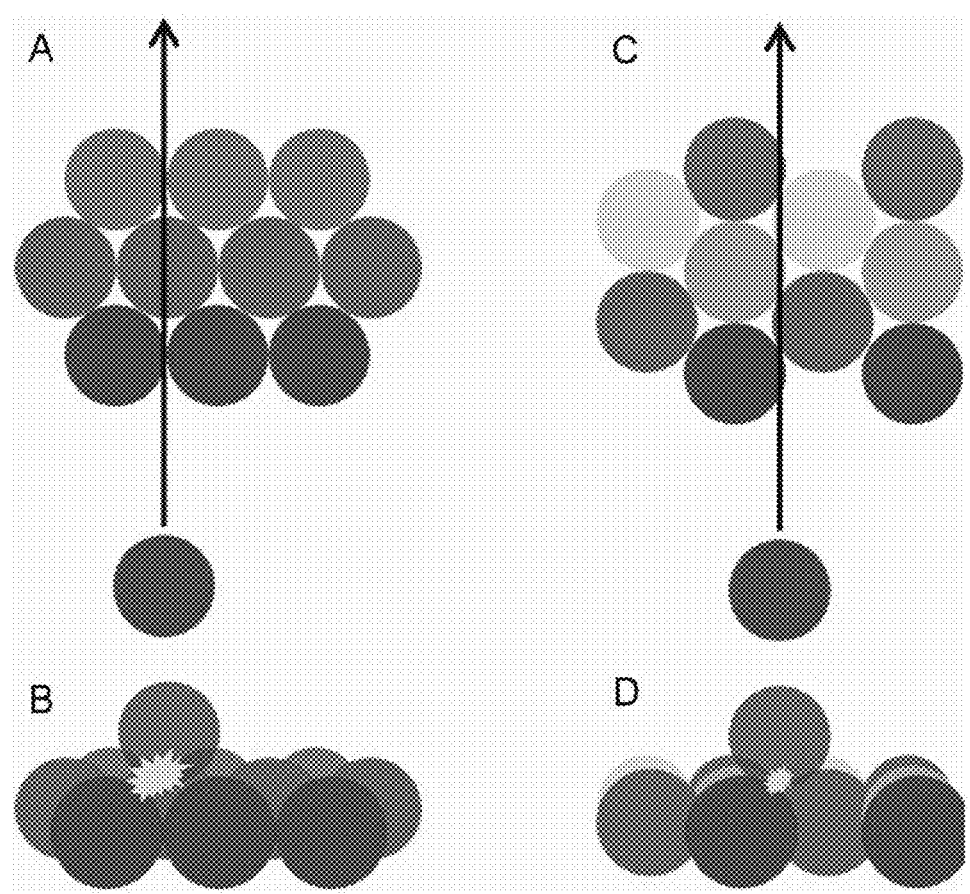
FIG. 9 is a schematic view showing that crystal grains are arranged in the direction to reduce friction during rubbing.

When a monolayer with randomly oriented multiple grains was rubbed in a uniaxial direction, the particles moved collectively along the rubbing direction. The particles prefer the <10> direction as an easy rolling path because each particle collides with one neighboring particle in the <10> direction of rolling but with two neighboring particles in the <11> direction of rolling (FIG. 9). The directional movement of the particles facilitated the merging of the crystal grains, which inspired the formation of a large single-crystal colloidal monolayer. That is, according to the present invention, the packing direction of particles close-packed during the rubbing process is determined according to the rubbing direction. During the rubbing process, the particles are close-packed in the direction along which friction during the rubbing is minimized.

Figure 11:
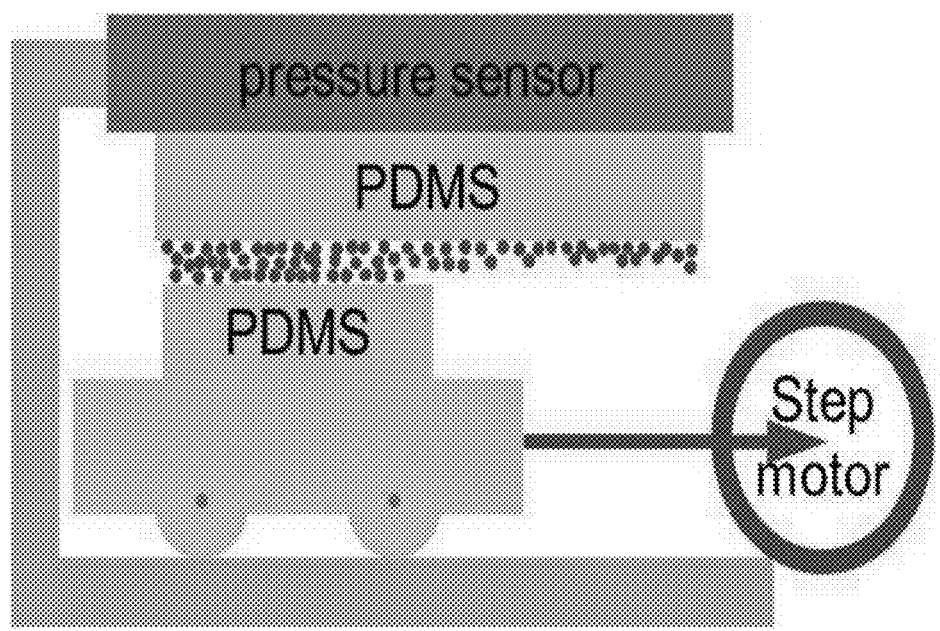
FIG. 11 is a schematic view showing the pressure and speed being independently controlled during unidirectional rubbing.
Figure 12:
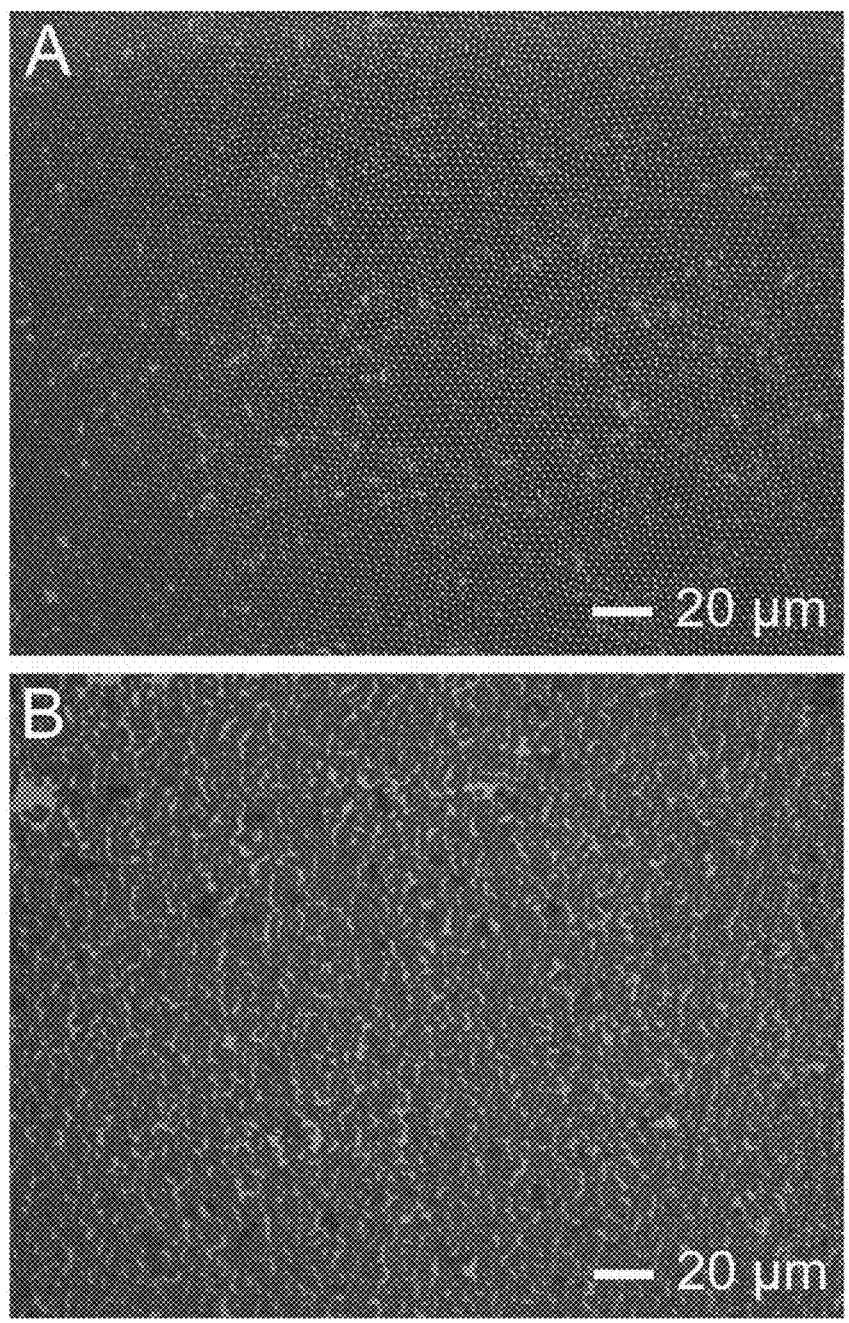
FIG. 12 is a view showing the defects due to the overall sliding of particles.

The practical processing variables for the collective rolling are normal pressure and the rubbing speed applied to the substrate. FIG. 10 demonstrates the grain growth by the uniaxial rubbing. A powder of PS particles (1 μm in diameter) was rubbed on a PDMS substrate (prepolymer:cross-linker=10:1, w/w) placed on a glass plate. After the formation of randomly oriented monolayer, uniaxial rubbing was applied under different normal pressures and rubbing speeds. The two variables were controlled independently (FIG. 11). The moving distance of the top substrate was fixed at 4 cm. FIGS. 2A-2C show the effect of the normal pressure on the grain merging at a constant rubbing speed (1.76 mm/s). The rubbing was carried out one time from right to left. The orientation of the crystal grains was monitored by the diffraction pattern obtained by beaming a commercial laser pointer (mainly 625 nm in wavelength) perpendicular to the colloidal monolayer. The beam size on the monolayer was 4 mm in diameter. Uniaxial rubbing at a pressure at or below 0.5 kg/cm$^2$ did not affect the crystal orientation as known from the circular diffraction ring. As the pressure increased further, grain growth and the directional orientation of the grains was clearly observed (0.75 kg/cm$^2$), and most of the grains merged into one grain at 2.00 kg/cm$^2$. The diffraction pattern showed clear hexagonal spots that are characteristic of a single-grain colloidal monolayer. FIGS. 10D-10F exhibit the effect of the rubbing speed on the grain merging under a constant normal pressure (0.5 kg/cm$^2$). The grain growth with respect to an increase in rubbing speed was monitored while controlling the normal pressure. When the rubbing speed was 3.52 mm/s, a large grain with the same orientation was observed and the diffraction pattern showed clear hexagonal spots. It was noted that too much pressure and too fast rubbing speed generated scratches. These scratches are mainly caused by the collective sliding of the particles (FIG. 12). This means that the scratches may be generated if the aggregated particles are rubbed in masses of particles due to fast rubbing before the aggregated particles are not completely separated into individual ones. Another reason for this defect is the removal of the disordered area and the grain boundaries by the grain merging, generating the loose assembly of a randomly oriented monolayer and therefore forming surfaces unoccupied by particles. This means that vacancies in the original defect are not filled with particles because there is no time sufficient to fill the vacancies.

Figure 10:
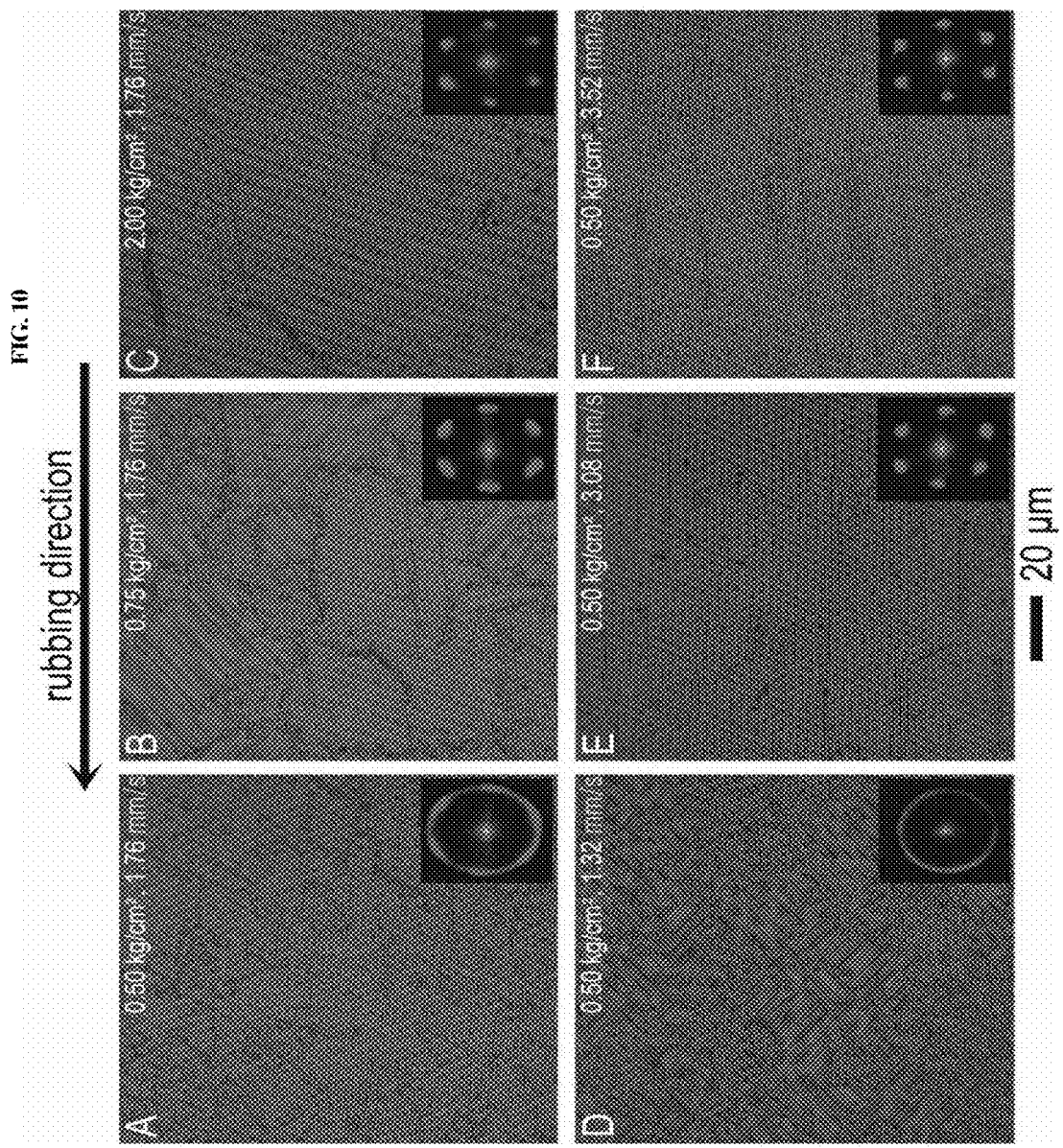
FIG. 10 is a view showing the effect of the rubbing speed and pressure upon the grain growth of monolayer crystals.
Figure 13:
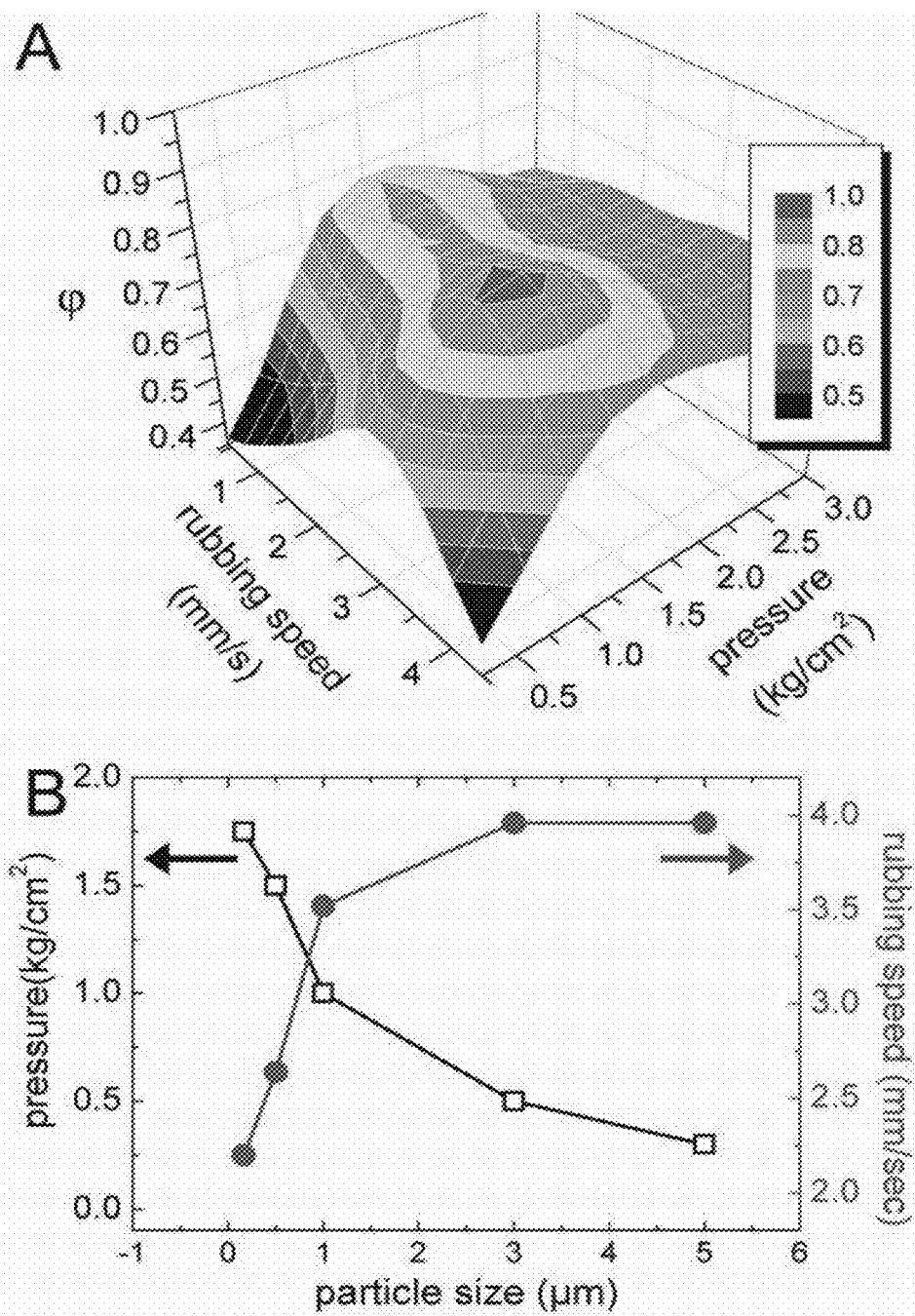
FIG. 13 is a view showing optimum conditions of pressure and rubbing speed for optimally arranging a particle monolayer.
Figure 14:
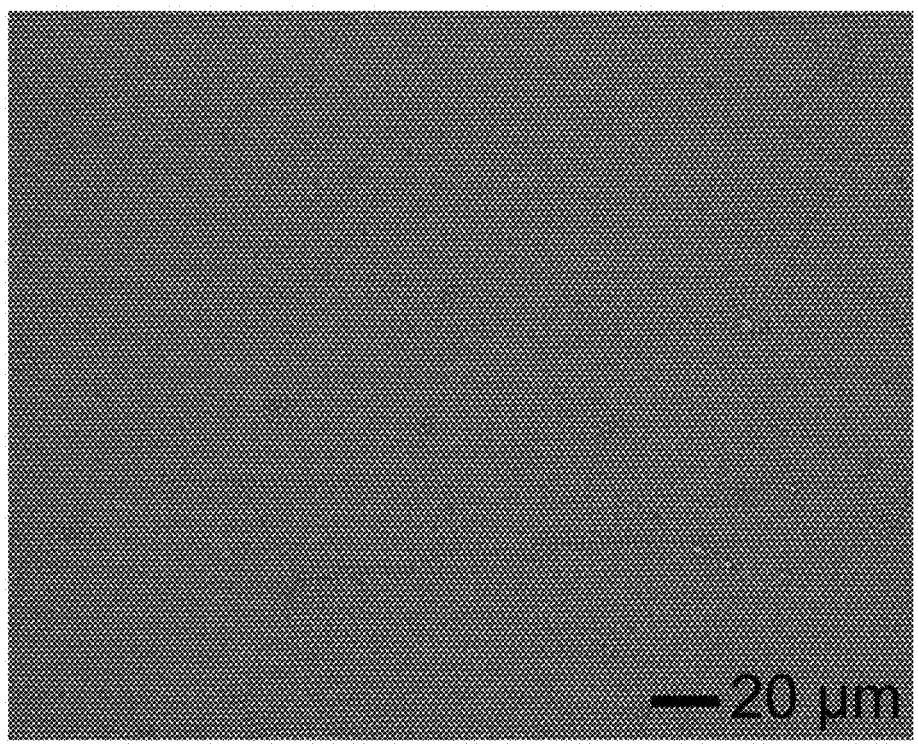
FIG. 14 is a view showing a sample having small line defects.

From the results in FIG. 10, it could be seen that there are an optimum normal pressure and rubbing speed for grain growth. FIG. 13A shows an example that tracks the optimum conditions for the PS particles (1 μm in diameter). Rubbing was applied one time from right to left. The moving distance of the top substrate was 4 cm. For a quantitative analysis, 2D laser-diffraction patterns according to various rubbing speed and pressure were obtained with a position-sensitive photodiode detector. In order to collect reliable data, the diffraction patterns were taken in a darkroom and the background noise was extracted. Azimuthal plots of the first-order peaks were employed to calculate the degree of orientation (φ) of the colloidal monolayer. The z-axis in FIG. 13 provides a plot of φ according to the rubbing speed and pressure. The optimum condition for 1 μm PS particles was found at a rubbing speed of 3.0 mm/s and a normal pressure of 2.00 kg/cm$^2$, at which the crystal had a small number of line defects at 100 μm×100 μm (FIG. 14) with crystal orientations that were identical at every sample position.

The grain growth caused by the uniaxial rubbing requires the rolling of particles by at least several times the particle size. This indicates that large particles must roll over a longer distance with greater tangential force; hence, they need fast rubbing and a small amount of external pressure. This is contrary to small particles, which require a relatively slow rubbing speed and greater pressure for grain growth. FIG. 13B shows the optimum conditions of the pressure and rubbing speed for PS particles with various sizes. The optimum rubbing speed increased with an increase of the particle size and did not change when the particle size was equal to or greater than 3 μm. To the contrary, the optimum pressure decreased steadily as the particle size increased. The optimum pressure for 170 nm particles was 8 times higher than that for 5 μm particles, but the rubbing speed for the 5 μm particles was twice that of the 170 nm particles. These experimental results indicate that the pressure is a more sensitive processing variable for the preparation of a single-crystal monolayer.

Figure 15:
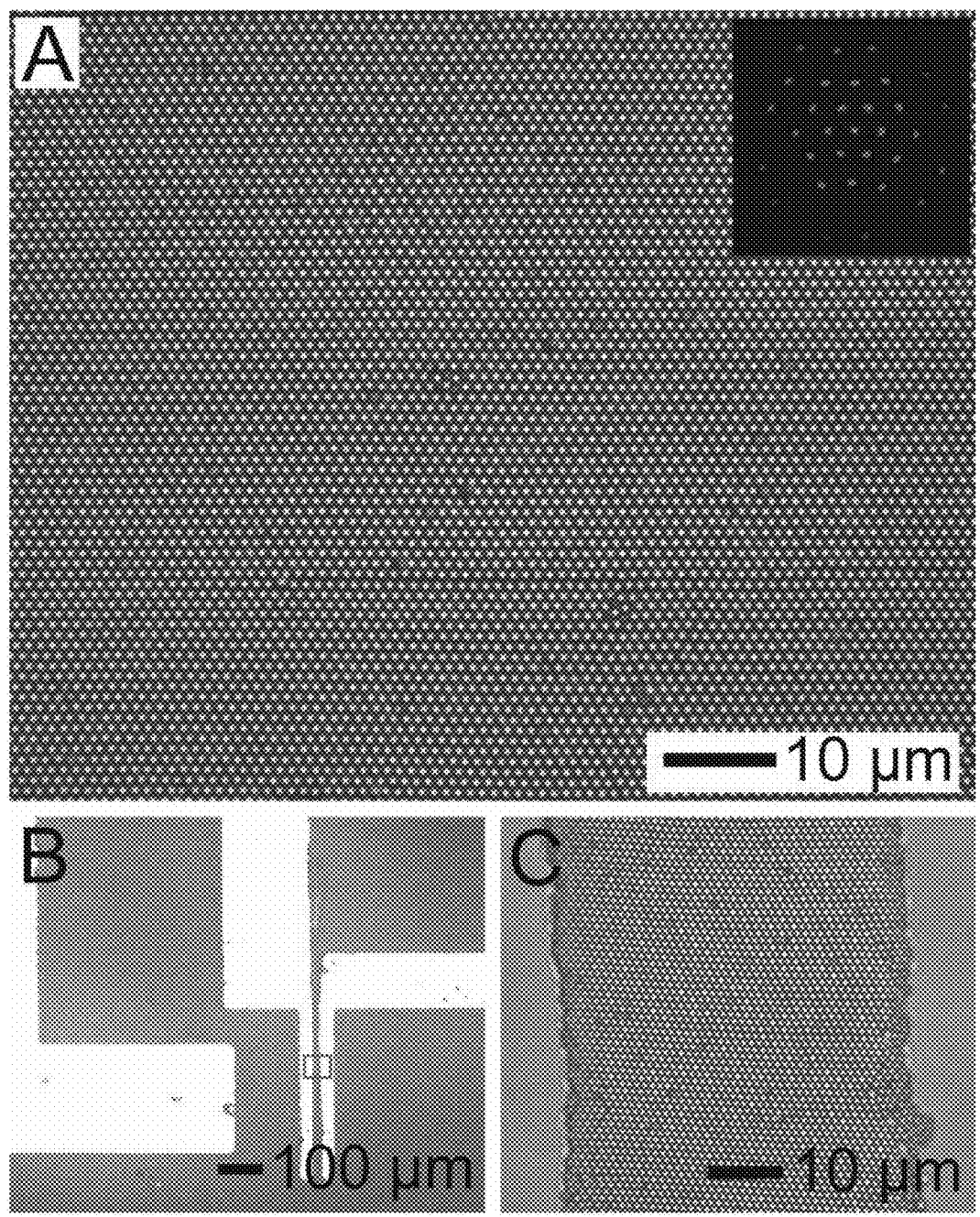
FIG. 15 is a view showing an example of micro-patterning of a particle monolayer.
Figure 16:
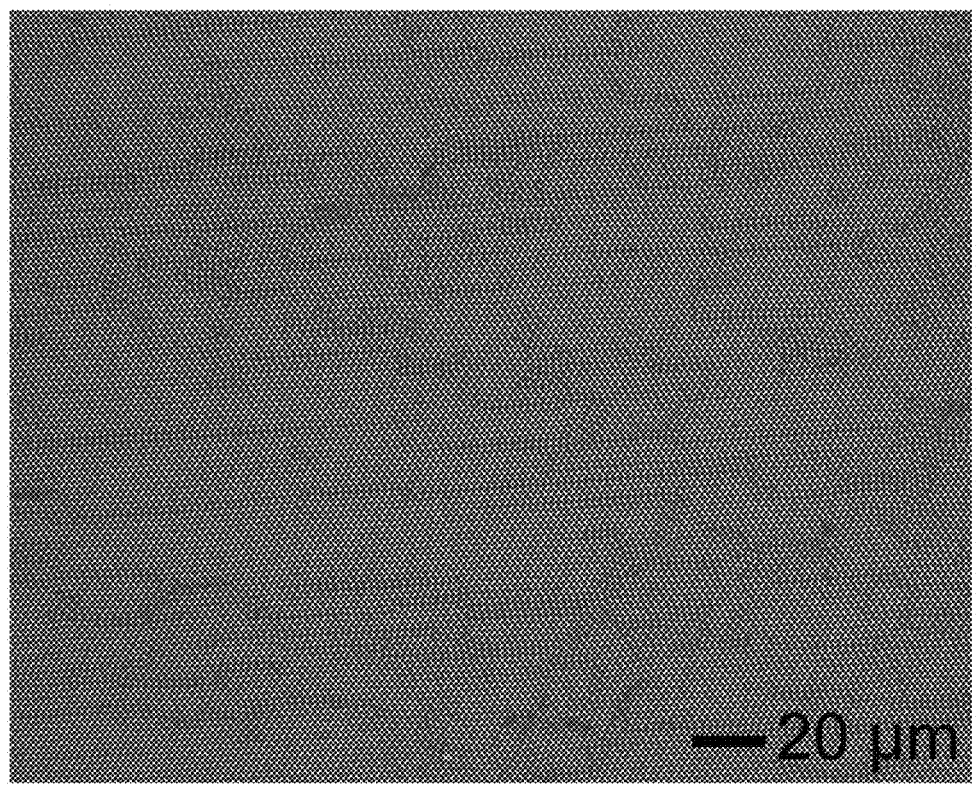
FIG. 16 is a view showing a sample having many line defects.

Form the foregoing, it could be known that the three key processing variables for the single-crystal colloidal monolayer: the tack energy of the substrate, the rubbing speed of the substrate, and the normal pressure on the substrate should be considered. FIG. 15A shows a wafer-scale single-crystal colloidal monolayer of 1 μm PS particles created by repeated uniaxial rubbing (10 round-trip strokes) at 3.5 mm/sec and 1.25 kg/cm$^2$ on a substrate with a tack adhesion energy level of 0.050 gf mm. A PDMS-coated glass plate was used as the substrate. In order to prevent the generation of the line defects caused by the removal of the disordered area and the grain boundaries, uniaxial rubbing was applied to the particle powder from the beginning. A slightly lower pressure than the optimum pressure for the one-time rubbing (FIG. 13A) was applied because the repeated rubbing at a high pressure often led to collective sliding of the particles, which caused defect lines in the crystal monolayer (FIG. 16). FIG. 15A shows a typical image of a monolayer which includes only several point defects without line defects. The diffraction pattern in the inset was obtained by the action of a red-light laser pointer with respect to a monolayer formed on a PDMS-coated glass substrate. The diffraction pattern shows distinct spots of higher orders. The beam size on the monolayer surface was 4 mm. Any position of the monolayer exhibited the identical diffraction pattern, which clearly confirms a well-defined single crystal on the entire surface of the substrate. The production of a wafer-scale single-crystal colloidal monolayer on a flat substrate is unprecedented in particle assembly research. That is, the size of the single crystal colloidal monolayer may also be formed to be larger according to the size of the substrate. The present process is immediately applicable to high-quality colloidal lithography.

Figure 17:
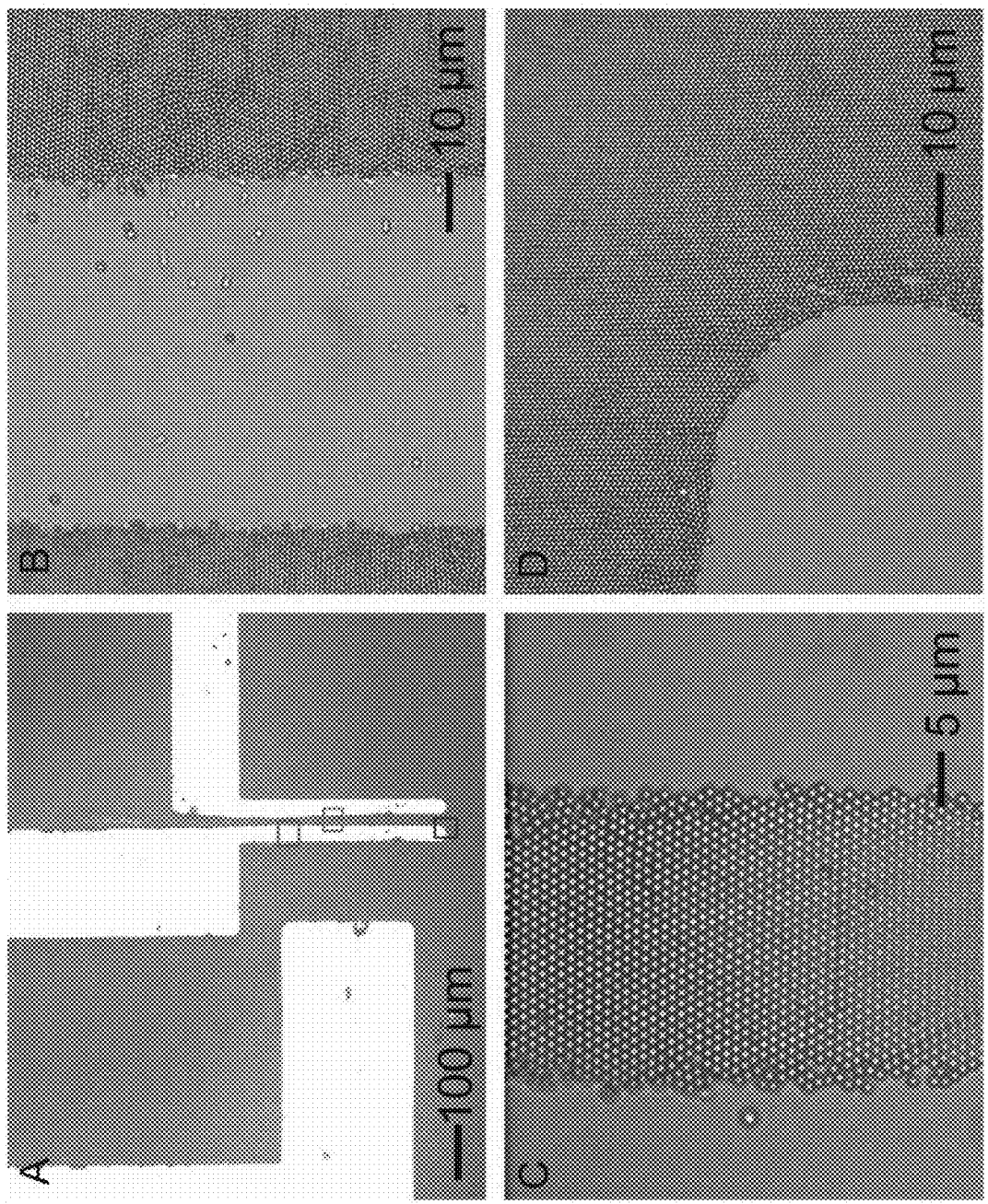
FIG. 17 is a view showing the same orientation of UVO treated colloidal crystal.

By taking advantage of the condition in which the minimum tack energy is required for particle assembly (FIG. 2), micro-patterning of a colloidal monolayer could be routinely accomplished. As an example, a PDMS surface was exposed to ultraviolet-ozone (UVO) through a metal mask. The adhesion energy of the UVO-treated surface was almost zero (0.001 gf mm); therefore, the particles slid on the hard surface to the neighboring rubbery surface (0.05 gf mm). In the end, the particles were assembled only on the rubbery areas and not on the hard surfaces. The uniaxial rubbing of the UVO-treated pattern allowed the same crystal orientation in any location of the assembly pattern. FIG. 15B exhibits an example of a colloidal pattern. FIG. 15C magnifies the crystal structure of a pattern with lines 50 μm wide made of 1 μm PS particles. The crystal structures of the other areas in FIG. 15B have the same single domain with an identical crystal orientation (FIG. 17). Like this, with the patterning of the adhesive surface of the substrate, only a desired region can be filled with particles.

Figure 18:
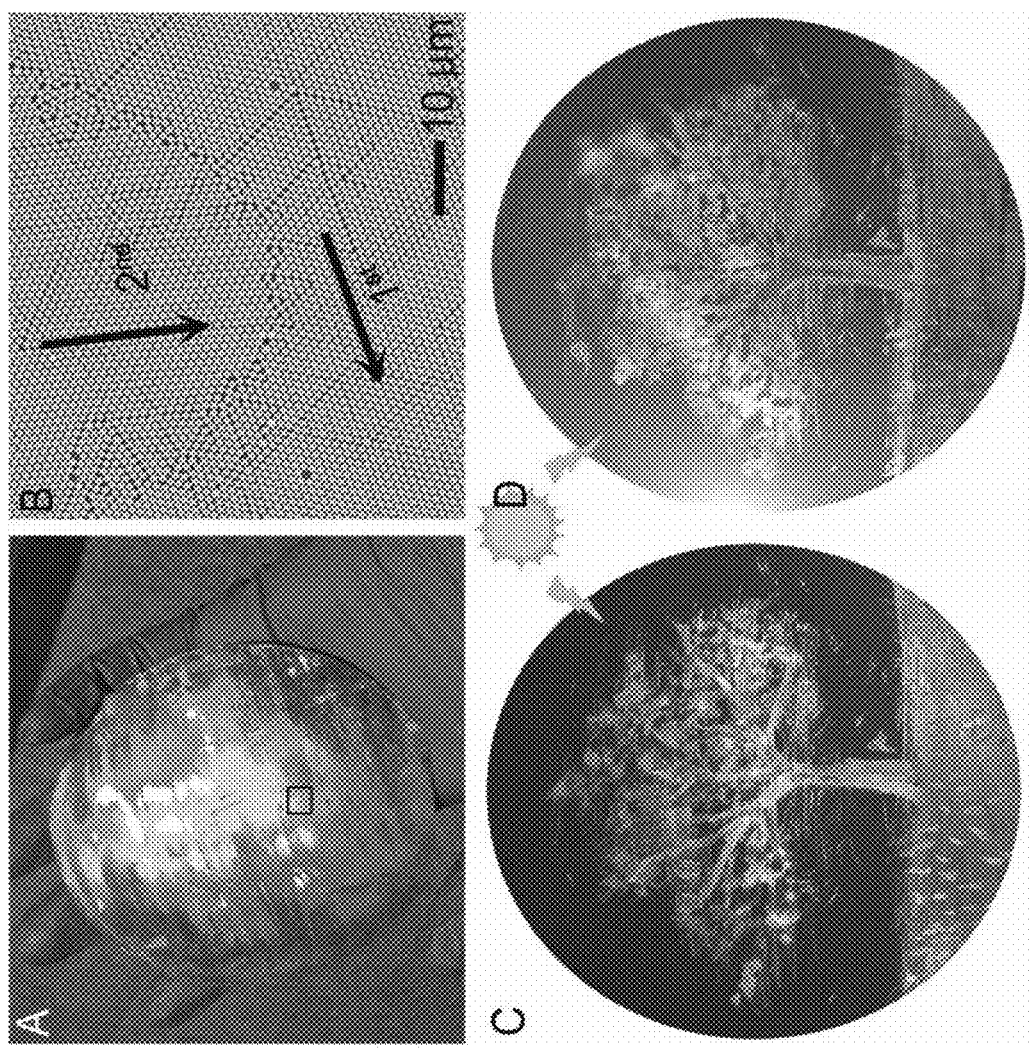
FIG. 18 is a view showing an example of photonic crystal painting according to the present invention.

Control of the crystal orientation in two-dimensional photonic crystals provides the possibility of color tuning by adjusting the diffracting crystal plane and the viewing angle. The simple rubbing process of the present invention allows unprecedented control of the crystal orientation. FIG. 18A displays the color change according to the rubbing direction. A powder of PS particles (1 μm in diameter) was roughly rubbed with a piece of PDMS attached to a PDMS-coated Si wafer so that the rubbing intersected at right angles. A full rainbow of colors was expressed on the entire surface of the wafer. FIG. 18B visualizes the crystal structure near the boundary (the solid box in FIG. 18A) between the yellow and orange areas. The crystals in the boundary region show distinct orientations and possess a clear crystallographic boundary. The shape of the boundary infers that the second rubbing with a round-shaped rubber stick intruded in the large single crystal monolayer created by the first rubbing. That is, the orientation by the first rubbing changed in direction due to the second rubbing, changing the color. The results of FIGS. 18A and 18B define the unique characteristics of the rubbing process: i) the reflected color is tunable, ii) the size of a colored area can be determined by the rubbed area, and iii) a colored area can be recolored by rubbing in a different direction. These coloring characteristics of the rubbing process of the present invention introduce a new concept of artistic painting which we term here photonic crystal painting. FIG. 18C demonstrates a painting of 'a tree in grass on a windy day'. It was drawn on a PDMS-coated four-inch Si wafer by rubbing photonic dyestuff (PS particle powder, 1 μm in diameter) with a rubber-coated pen. Because the color of the photonic crystal depends on the incident angle of the light, slight tilting of the wafer gives completely different color sets for an identical painting (FIG. 18D), which is similar to lacquer work inlaid with mother-of-pearl.

Figure 19:
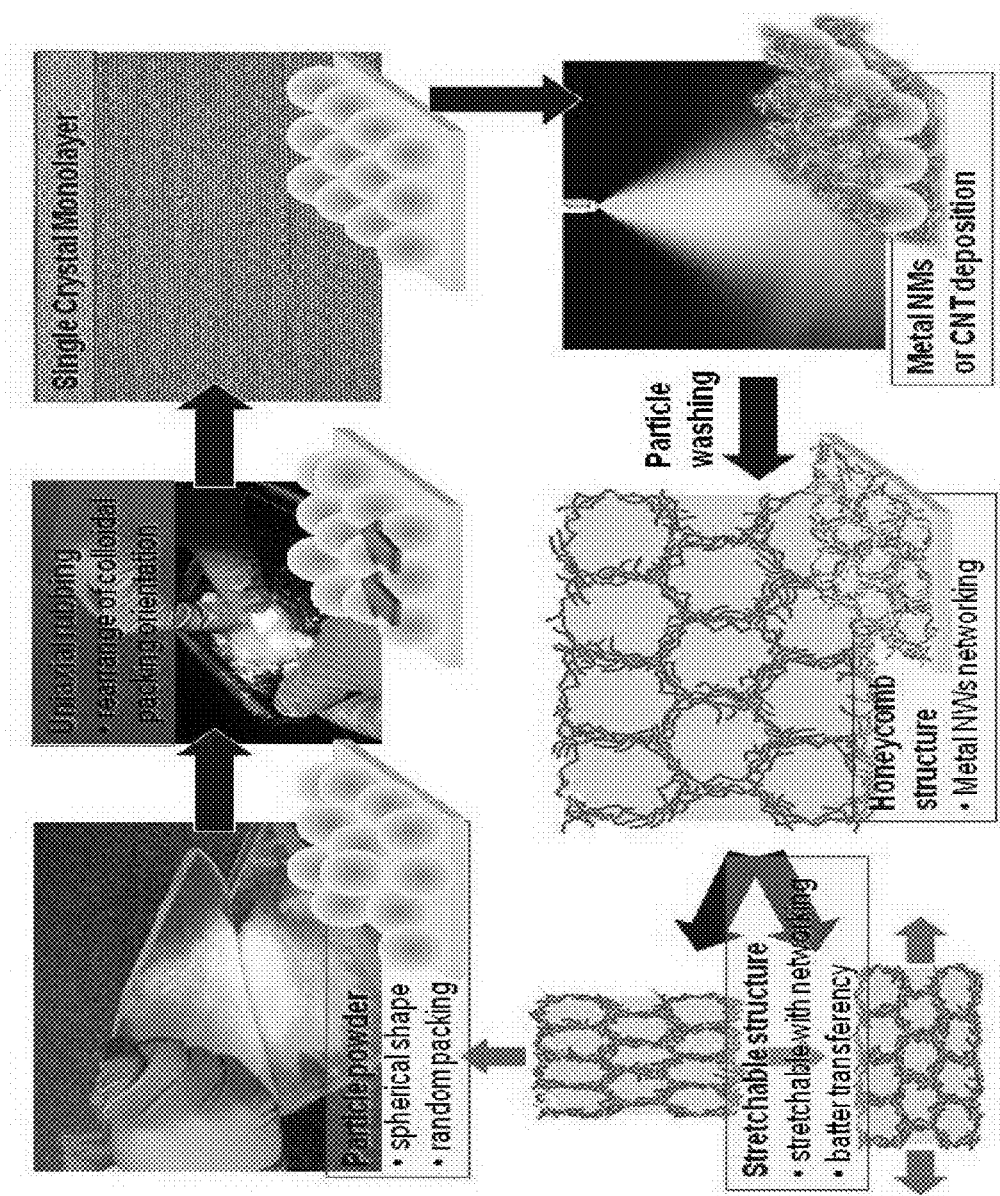
FIG. 19 is a view showing a procedure of forming CNT or metal nano-wire network according to another embodiment of the present invention.

In the meantime, the present invention can constitute a network with CNT or the like by employing the above-mentioned principle. That is, as schematically shown in FIG. 19, according to the above method, particles are close-packed on the substrate, thereby forming a single crystal monolayer.

Subsequently, a CNT or metal nano-wire dispersed solution was provided on the close-packed single crystal monolayer by means of spraying, dipping, dropping or the like. Then, the solution penetrates between the grains, so that the CNT or the metal nano-wire is hexagonally networked at a region other than the portion where the grains exist, thereby forming a honeycomb structure.

When the honeycomb structure network is formed, the portion of the grains remains transparent, thereby relatively improving the transparency. That is, it is more transparent than a randomly dispersed common substrate (glass or PDMS). Since the density of the surface is generally lower than nano-wires distributed over the PDMS (the honeycomb type network is only formed on a desired region), the transparency is high. In addition, the network structure CNT or metal nano-wire can be stretched or flexible, and exhibits high electrical conductivity. Additionally speaking, the honeycomb structure is strong and is stretchable in all directions. In addition, the network is composed of a single crystal, thus having no grain boundaries, so that it has the same stretching direction and the same thickness in the whole length, therefore the high electrical conductivity. Further, according to the present invention, since a colloidal layer single-crystallized in one direction by uniaxial rubbing is used, a defect-less hexagonal network is formed, thereby having additional advantages of forming a large-area network without cracks when it is elongated or bent. Such a structure is applicable to a flexible transparent electrode, thereby possibly fabricating a substrate having a highly flexible electrode pattern.

The uniaxial rubbing of the particles described in the present invention introduces a quick, simple, inexpensive route to assemble spherical particles into a single-crystal monolayer on a flat substrate. The particles under rubbing collectively roll along the rubbing direction so that the initial multiple grains merge to form a large single grain. The practical key variables for the monolayer assembly are the tack energy of the substrate, the rubbing speed, and the normal pressure. Optimum rubbing conditions for the single-crystal monolayer can be varied according to the size of particles, but in general, the following tenets apply: i) the process is applicable to any typical rubber surface as long as the surface is not too sticky or too hard; submicron particles require high pressure and slow rubbing, while microparticles need low pressure and fast rubbing; and repeated uniaxial rubbing can minimize line defects. Utilizing the tack energy condition, a bottom-up complicated micro-pattern of colloidal monolayer is successfully fabricated over a large area on a flat substrate. The rubbing on the monolayer changes the orientation of the crystal along the rubbing direction, hence changing the diffraction from the crystal. This capability to tune the color in an arbitrary direction by simple rubbing suggests that photonic crystal painting can be applied as a novel technique for fine art painting and industrial color design. In addition, the present invention is adaptable to applications of coating the entire surface of a transparent conductive electrode, forming a high-conductive transparent coating having the conductivity that does not change even upon stretching or deformation, fabricating a substrate having a highly flexible electrode pattern and therefore developing a flexible display.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A method of fabricating a single crystal colloidal monolayer on a substrate, the method comprising:
   preparing a pair of adhesive substrates;
   arranging powder particles between the substrates; and
   uniaxially rubbing one of the substrates in any one direction to allow the particles to be close-packed between the substrates, thereby forming a single crystal monolayer.

2. The method according to claim 1, wherein the substrate comprises a substrate made of a rubbery material.

3. The method according to claim 1, wherein the substrate comprises a substrate in which a rubbery material is formed on a non-elastic base substrate.

4. The method according to claim 2, wherein the rubbery material comprises PDMS.

5. The method according to claim 1, wherein the stage of forming the single crystal monolayer comprises:
   individually separating the powder particles one by one; and
   rolling-moving and close-packing the separated powder particles over the entire surface of the substrate.

6. The method according to claim 5, wherein the tack energy or adhesion energy between the particle and the substrate is greater than that between the particles.

7. The method according to claim 6, wherein the powder particles are only moved by rolling without sliding for the close-packing of powder particles over the entire surface of the substrate.

8. The method according to claim 5, wherein the packing direction of the particles is determined by the uniaxial rubbing direction.

9. The method according to claim 5, wherein the rolling is performed faster and under a lower pressure as the size of the particle increases.

10. The method according to claim 1, further comprising, before the arrangement of the powder particles between the substrates, patterning the adhesive surfaces of the substrates such that the particles are only close-packed on a specified region where the adhesion still remains.

11. The method according to claim 10, wherein the stage of patterning the adhesive surfaces of the substrates comprises patterning the surfaces of the substrates via ultraviolet-ozone (UVO) treatment such that particles are only close-packed on a specified region where the UVO treatment is not performed.

12. The method according to claim 1, further comprising distributing a CNT or nano-wire dispersed solution over the single crystal monolayer on the substrates, thereby forming a network structure in which the CNT or nano-wire I networked at a portion other than a region where the particles exist.

13. A method of fabricating a single crystal colloidal monolayer on a substrate, the method comprising:
   preparing a pair of adhesive substrates;
   patterning the adhesive substrates via ultraviolet-ozone (UVO) treatment;
   arranging powder particles between the substrates; and
   rubbing one of the substrates to allow the particles to be close-packed between the substrates, thereby forming a single crystal monolayer.

14. The method according to claim 13, wherein the substrate comprises a substrate made of a rubbery material.

15. The method according to claim 13, wherein the substrate comprises a substrate in which a rubbery material is formed on a non-elastic base substrate.

16. The method according to claim 14, wherein the rubbery material comprises PDMS.

17. The method according to claim 1, wherein the stage of forming the single crystal monolayer comprises:
  individually separating the powder particles one by one; and
  rolling-moving and close-packing the separated powder particles over the entire surface of the substrate.

18. The method according to claim 17, wherein the tack energy or adhesion energy between the particle and the substrate is greater than that between the particles.

19. The method according to claim 18, wherein the powder particles are only moved by rolling without sliding for the close-packing of powder particles over the entire surface of the substrate.

* * * * *